United States Patent
Ishida et al.

(10) Patent No.: US 6,736,945 B2
(45) Date of Patent: May 18, 2004

(54) WAFER PLATING APPARATUS (75) Inventors: Hirofumi Ishida, Atsugi (JP); Yoshiyuki Harima, Shiroyama-machi (JP)

(73) Assignees: Electroplating Engineers of Japan Limited, Tokyo (JP); Tokyo Electron Limited, Tokyo (JP)

( * ) Notice: Subject to any disclaimer, the term of this patent is extended or adjusted under 35 U.S.C. 154(b) by 280 days.

(21) Appl. No.: 09/791,840

(22) Filed: Feb. 26, 2001

(65) Prior Publication Data

US 2001/0017258 A1 Aug. 30, 2001

(30) Foreign Application Priority Data

Feb. 28, 2000 (JP) ........................................ 2000-050949

(51) Int. Cl.[7] ........................... C25D 17/00; C25D 17/06
(52) U.S. Cl. ................. 204/212; 204/224 R; 204/278; 204/297.01
(58) Field of Search ............................ 204/212, 224 R, 204/278, 297.01, 297.06

(56) References Cited

U.S. PATENT DOCUMENTS

| | | | |
|---|---|---|---|
| 3,964,841 A | * | 6/1976 | Strycek ................. 416/186 R |
| 5,222,310 A | * | 6/1993 | Thompson et al. ............ 34/202 |
| 5,447,615 A | * | 9/1995 | Ishida ..................... 204/224 R |
| 6,159,354 A | * | 12/2000 | Contolini et al. ............. 205/96 |
| 2002/0027081 A1 | * | 3/2002 | Nagai et al. ................ 205/157 |

FOREIGN PATENT DOCUMENTS

JP 05-243235 A 9/1993

* cited by examiner

*Primary Examiner*—Nam Nguyen
*Assistant Examiner*—Brian L Mutschler
(74) *Attorney, Agent, or Firm*—Rothwell, Figg, Ernst, Manbeck, P.C.

(57) ABSTRACT

A wafer plating apparatus includes a wafer clamp for holding a wafer, a wafer support member for supporting the peripheral edge of the surface to be plated, and a plating tank which circulates a plating solution while making the plating solution overflow from an upper opening of the tank. The wafer plating apparatus is arranged to perform plating, while the surface to be plated is laid face down, being in contact with the surface of the plating solution, in a state in which the wafer is clamped by the wafer clamp and the wafer support member. The wafer support member is equipped with air-vent grooves for discharging the air which remains on the peripheral edge of the surface to be plated while the surface of the plating solution and the wafer make contact. The air-vent grooves are formed at the lower end of the wafer support portion.

8 Claims, 9 Drawing Sheets

WAFER PLATING APPARATUS

BACKGROUND OF THE INVENTION

1. Field of the Invention

The present invention relates to a wafer plating apparatus for plating wafers for use in semiconductors.

2. Description of the Related Art

Hitherto, as a wafer plating apparatus for use in semiconductors, there is known one which performs plating while the wafer surface to be plated is laid face down, being kept in contact with the surface of a plating solution overflowing from a plating tank.

Figure 9:
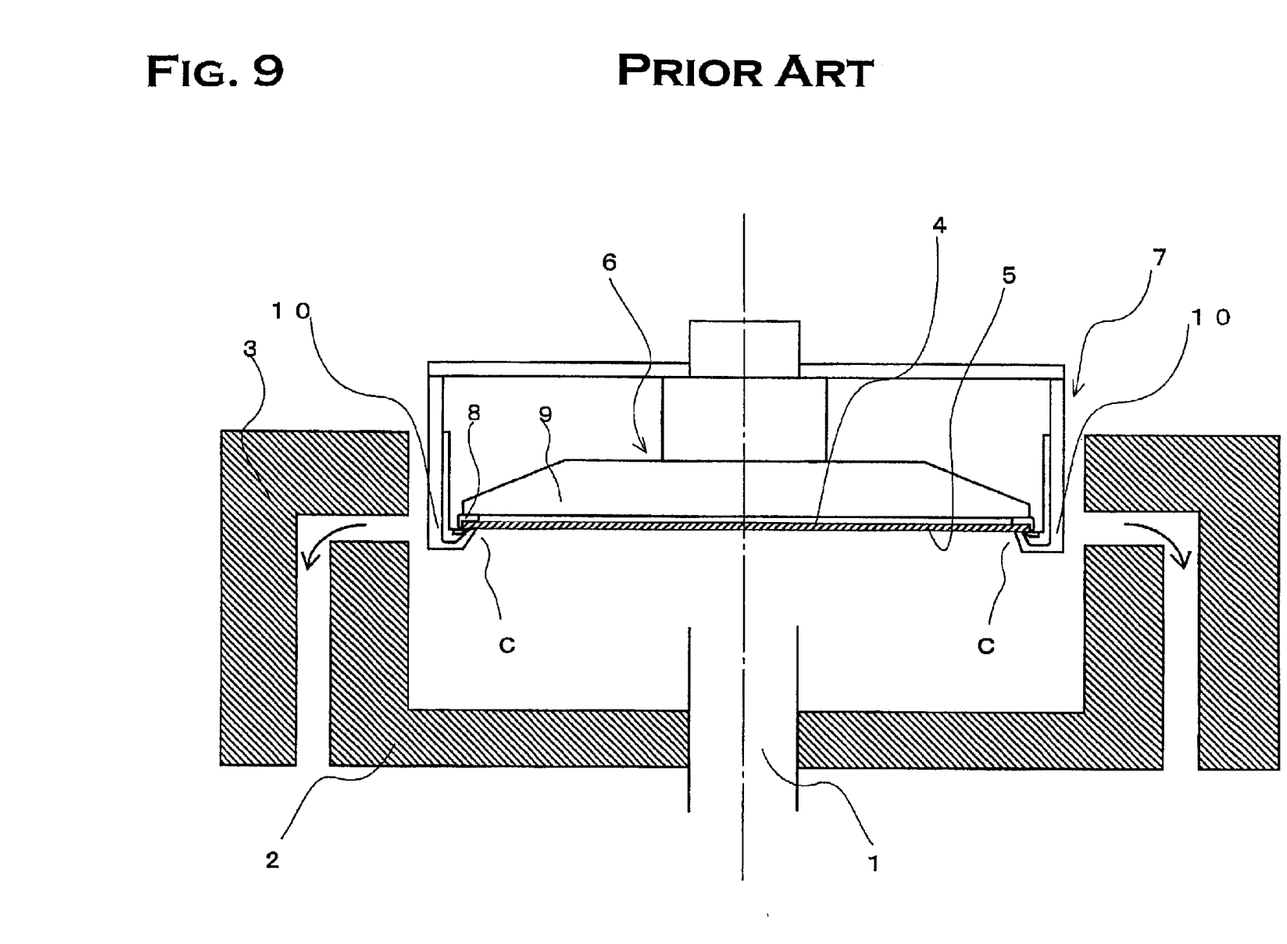
FIG. 9 is a schematic sectional view showing a conventional wafer plating apparatus.

Specifically, as shown in FIG. 9, the above-described wafer plating apparatus includes a wafer clamp 6 for holding a wafer 4 with the surface to be plated 5 of the wafer 4 facing down, a wafer support member 7 capable of supporting the surface to be plated 5 over the entire peripheral edge thereof, and a plating tank 2 capable of circulating a plating solution while making the plating solution overflow from the upper opening thereof. This wafer plating apparatus is arranged so as to perform plating while the surface to be plated 5 is laid face down, being maintained in contact with the surface of the plating solution, in a state in which the wafer 4 is clamped by the wafer clamp 6 and the wafer support member 7.

After the plating has been performed, this wafer plating apparatus withdraws the wafer 4 from the plating solution and rotates the wafer 4 so as to remove the plating solution adhering to the plated surface 5. Therefore, even when a plated film prone to dissolution into the plating solution is formed, there is no risk that the plated film is dissolved by the adhering plating solution while the wafers 4 are exchanged. This results in the plated surface being provided with a superior appearance and the cleaning process in a post-treatment being simplified. Furthermore, this wafer plating apparatus has an advantage in that a uniform plated film can be formed over the entire surface to be plated 5 by rotating the wafer 4 during a plating process.

However, since the wafer support member 7 of this wafer plating apparatus typically has a wafer support portion 10 having an L-shaped cross-section, the wafer support portion 10 and the surface to be plated 5 form a corner portion C. In the the corner portion C, air contained in the plating solution remains. This is because the plating solution moves toward the peripheral edge of the surface to be plated 5, and hence the flow of the plating solution is prone to stagnate in the corner C which constitutes a small step, with the result that air contained in the plating solution also remains therein. Air, which is thus prone to remain at the peripheral edge, causes non-uniform plating at the corner portion and reduces the plating area, that is, the available area of a wafer. This is undesirable in view of the production yield.

The conventional wafer plating apparatus is arranged so that plating is not started until the air remaining on the surface to be plated is discharged to the outside to some extent, in order to suppress the above-described influence of air. As a result, if plating is conducted on a wafer surface to be plated which has been coated with a metallic film such as Cu, that is, a surface coated with a so-called seed metal, using a plating solution so as to dissolve the seed metal, the seed metal in contact with the plating solution will be dissolved while air is discharged, and consequently, uniform plating may not be performed.

SUMMARY OF THE INVENTION

It is, therefore, an object of the present invention to provide a technique for removing air remaining on the peripheral edge of the surface to be plated in the conventional wafer plating apparatus, and to provide a wafer plating apparatus capable of performing a more uniform plating up to the peripheral edge of the surface to be plated, and further capable of plating while minimizing the dissolution of the seed metal, even when the wafer is one coated with a seed metal.

In order to solve the above-described problems, the present inventors provide a wafer plating apparatus as follows. First, in a first aspect of the invention, there is provided a wafer plating apparatus which comprises a wafer support member having a wafer clamp for holding a wafer with the wafer surface to be plated facing down, and having a wafer support portion which has an L-shaped cross-section and which is capable of supporting the surface to be plated over the entire peripheral edge thereof; and a plating tank which circulates a plating solution while making the plating solution overflow from an upper opening of the tank. This wafer plating apparatus is arranged so as to perform plating, while the wafer surface to be plated is laid face down, being maintained in contact with the surface of the plating solution, in a state in which the wafer is clamped by the wafer clamp and the wafer support member. In this wafer plating apparatus, the wafer support member has air-vent grooves for discharging the air remaining on the peripheral edge of the surface to be plated while the surface of the plating solution and the wafer are in contact with each other, the air-vent grooves being formed at the lower end of the wafer support portion.

The "air-vent grooves" in the first aspect of the invention refers to ones which are constructed by forming a wafer support portion into a so-called comb-tooth configuration along the peripheral edge of the surface to be plated. The wafer support portion has a slight level difference to the surface to be plated. The air-vent grooves in the first invention are constructed by forming spots where this level difference has been minimized, at the lower end of the wafer support portion. Hence, the air tending to remain on the peripheral edge is discharged to the outside of the wafer support portion through these air-vent grooves, which prevents the air from remaining on the peripheral edge of the surface to be plated. In this case, the shape and the number of the air-vent grooves are not particularly limited. The optimum shape of the air-vent grooves may be appropriately determined in consideration of the scale of the wafer shape, the difference in the amount of generated air due to different plating solutions, etc.

Next, in a second aspect of the invention, the present inventors provide a wafer plating apparatus which comprises a wafer support member having a wafer clamp for holding a wafer with the wafer surface to be plated face down, and having a wafer support portion which has an L-shaped cross-section and which is capable of supporting the surface to be plated over the entire peripheral edge thereof; and a plating tank which circulates a plating solution while making the plating solution overflow from an upper opening. This wafer plating apparatus is arranged so as to perform plating, while the wafer surface to be plated is laid face down, being maintained in contact with the surface of the plating solution, and while the wafer is rotated, in a state in which the wafer is clamped by the wafer clamp and the wafer support member. In this wafer plating apparatus, the wafer support member has a spiral groove for discharging the air remaining on the peripheral edge of the surface to be plated while the surface of the plating solution and the wafer are in contact with each other, the spiral groove being formed on the inner peripheral surface side of the wafer support portion.

The "inner peripheral surface" of the support portion in the second invention refers to the side which constitutes a level difference to the surface to be plated. On this inner peripheral surface, a spiral groove, a so-called thread groove, is formed. The spiral groove is formed from the side of the surface to be plated to the lower end of the wafer support portion, in the inner peripheral surface of the wafer support portion. More specifically, the spiral groove is formed so that, while the wafer is rotated, that is, while the wafer support portion is rotated, the spiral groove proceeds, with the rotation, from the side of the surface to be plated to the lower end of the wafer support portion. When the wafer plating is performed with a spiral groove provided, while the wafer is rotated, the air tending to remain on the peripheral edge enters into the spiral groove, moves along the travel direction of the spiral groove, and is ultimately discharged to the outside. In this case, the shape and the pitch of the spiral groove are not particularly limited. The optimum shape of the spiral groove may be appropriately determined in consideration of the scale of the wafer shape, the difference in the amount of generated air due to different plating solutions, etc.

Next, as a third invention, the present inventors provide a wafer plating apparatus which comprises a wafer support member having a wafer clamp for holding a wafer with the wafer surface to be plated facing down, and having a wafer support portion which has an L-shaped cross-section and which is capable of supporting the surface to be plated over the entire peripheral edge thereof; and a plating tank which circulates a plating solution while making the plating solution overflow from an upper opening. This wafer plating apparatus is arranged so as to perform plating, while the wafer surface to be plated is laid face down, being maintained in contact with the surface of the plating solution, and while the wafer is rotated, in a state in which the wafer is clamped by the wafer clamp and the wafer support member. In this wafer plating apparatus, the wafer support member has guide wings for discharging the air remaining on the peripheral edge of the surface to be plated while the surface of the plating solution and the wafer are in contact with each other, the guide wings being formed at the lower end of the wafer support portion.

The "guide wings" in the third aspect of the invention refers to ones which are provided from the vicinity of the surface to be plated along the lower end of the wafer supporting portion, on the inner peripheral surface, and which are plurally arranged on the entire periphery of the wafer support portion, radially with respect to the center of the wafer. With such guide wings provided, the air tending to remain on the peripheral edge is discharged to the outside of the wafer support portion, while the wafer is rotated, that is, while the wafer support portion is rotated. In this case also, the shape and the number of the guide wings are not particularly limited. The optimum shape of the guide wings may be appropriately determined in consideration of the scale of the wafer shape, the difference in the amount of generated air due to different plating solutions, etc.

Furthermore, in the above-described first through third aspects of the invention, in order to completely remove air, and to eliminate the flow stagnation of the plating solution occurring on the peripheral edge of the surface to be plated, it is preferable that a solution-supply nozzle be provided in the plating tank, the solution-supply nozzle forcibly supplying the plating solution to the peripheral edge of the surface to be plated. This allows the plating on the peripheral edge of the surface to be more uniform.

DESCRIPTION OF THE PREFERRED EMBODIMENTS

Hereinafter, the preferred embodiments of the wafer plating apparatus according to the present invention will be described.

First Embodiment

Figure 1:
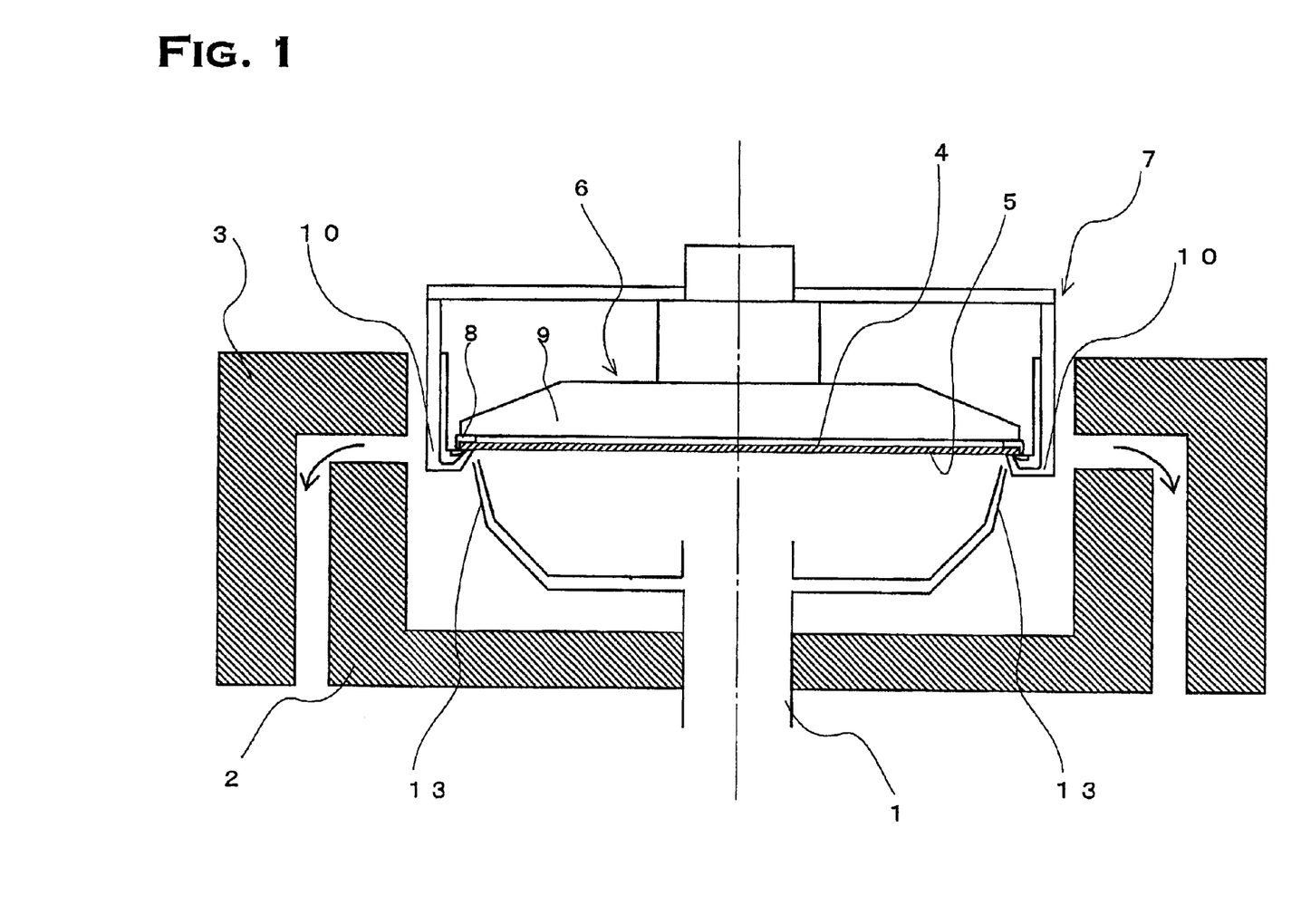
FIG. 1 is a schematic sectional view showing a wafer plating apparatus in accordance with a first embodiment.
Figure 2:
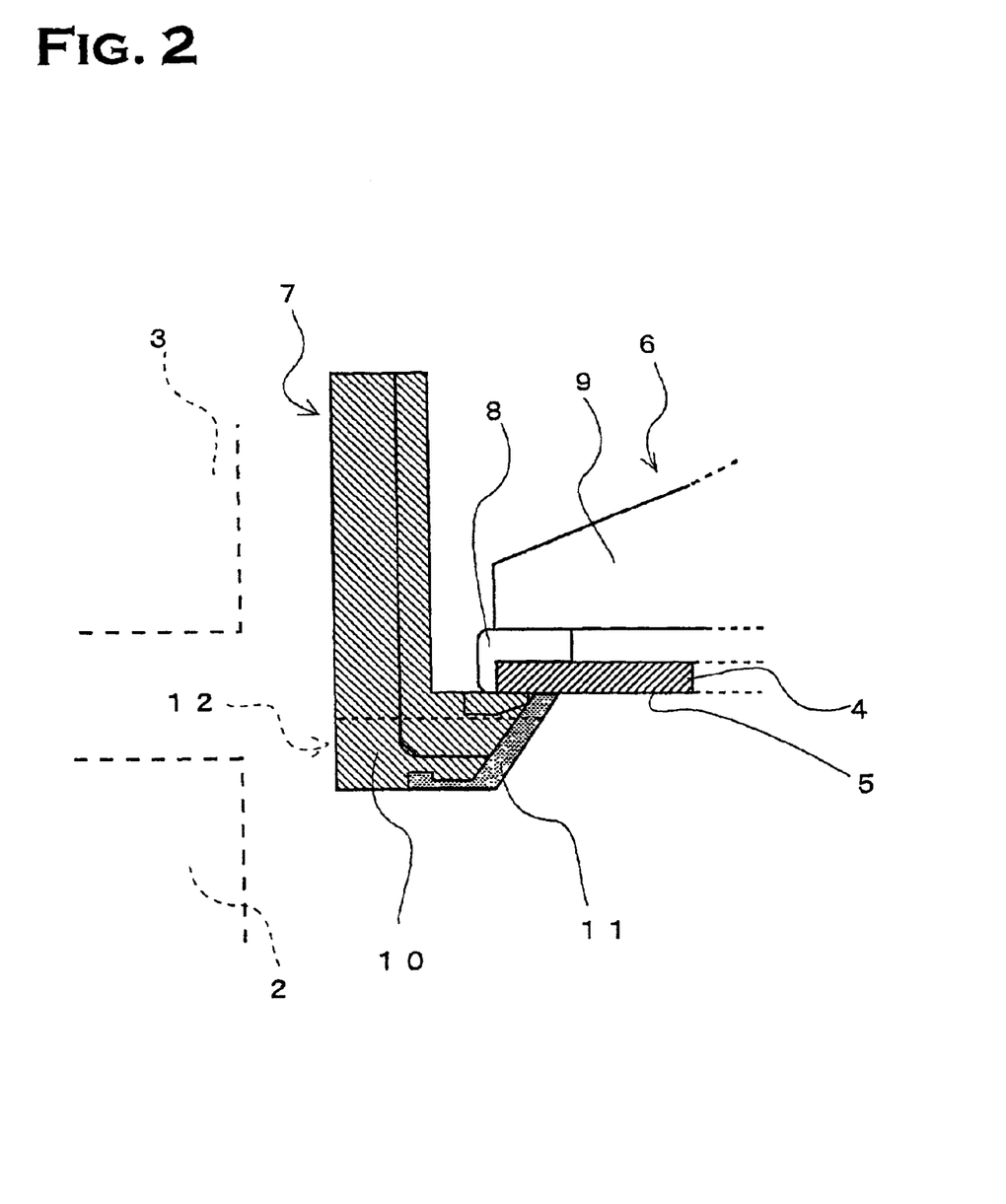
FIG. 2 is a partially enlarged sectional view showing the wafer plating apparatus in accordance with the first embodiment.
Figure 3:
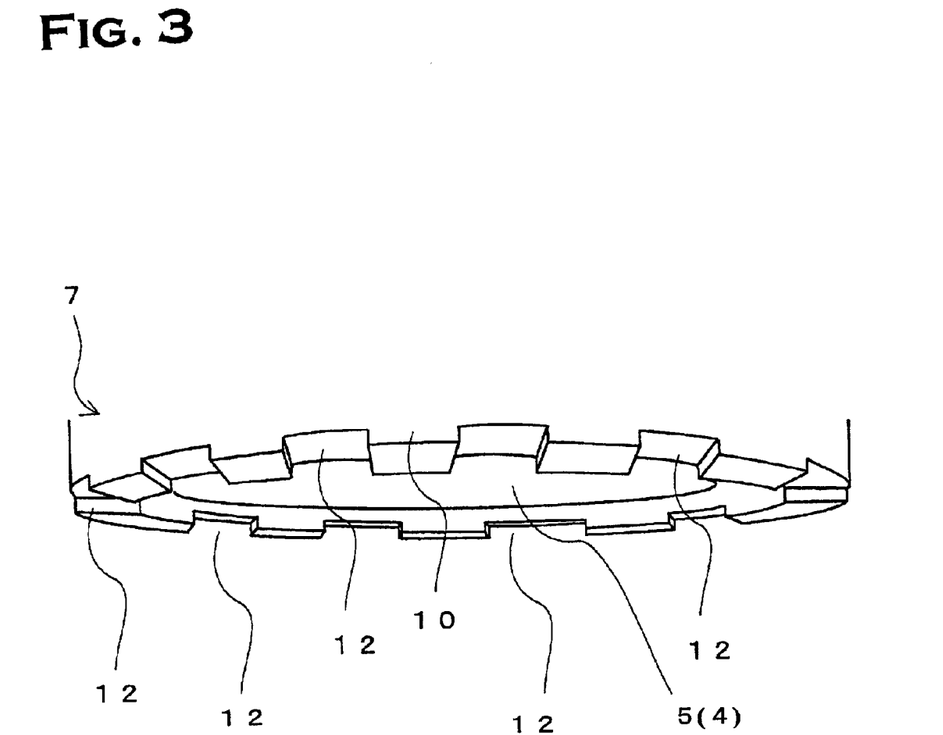
FIG. 3 is a schematic perspective view showing a wafer support member in accordance with the first embodiment.

First, in a first embodiment, a wafer plating apparatus equipped with air-vent grooves will be explained. FIGS. 1 through 3 are related to the wafer plating apparatus according to the first embodiment. FIG. 1 is a schematic sectional view, FIG. 2 is an enlarged view showing one portion of the wafer plating apparatus shown in FIG. 1, and FIG. 3 is a perspective view showing a wafer support member thereof.

As shown in FIG. 1, the wafer plating apparatus in accordance with the first embodiment has a plating tank 2 supplying a plating solution through a supply pipe 1 and overflowing the plating solution from an upper opening, and has an outer tank 3 surrounding the plating tank 2 and circulating the plating solution overflowing from the plating tank 2. The wafer plating apparatus is further provided with: a wafer clamp 6 capable of holding the wafer 4 with the surface 5 to be plated facing down so as to opposed to the overflowing plating solution; and a wafer support member 7 capable of supporting the surface to be plated 5 of the wafer 4 over the entire peripherry thereof.

Both the wafer clamp 6 and the wafer support member 7 are vertically movable, and are horizontally rotatable while supporting the wafer 4. As shown in FIG. 2, the wafer clamp 6 is formed of a clamp seal 8 for holding the side peripheral surface of the wafer 4, and a clamp body 9. The wafer support member 7 is formed of a wafer support portion 10 having an L-shaped cross-section and a liquid seal 11 provided on the inner peripheral surface side of the support portion.

As shown in FIG. 3, the air-vent grooves 12 are formed into a comb-tooth configuration on the wafer support portion. Since the level difference between each of the air-vent grooves 12 and the surface to be plated 5 is very small, the air-vent grooves 12 can discharge the air prone to reside on the peripheral edge of the surface to be plated, to the outside.

Also, a solution-supply nozzle 13 is disposed in the plating tank 2, the solution-supply nozzle being capable of supplying the plating solution to the peripheral edge of the surface to be plated 5. Supplying the plating solution through the solution-supply nozzle 14 to the surface to be plated 5 facilitates the discharge of air from the air-vent grooves 12.

Second Embodiment

Figure 4:
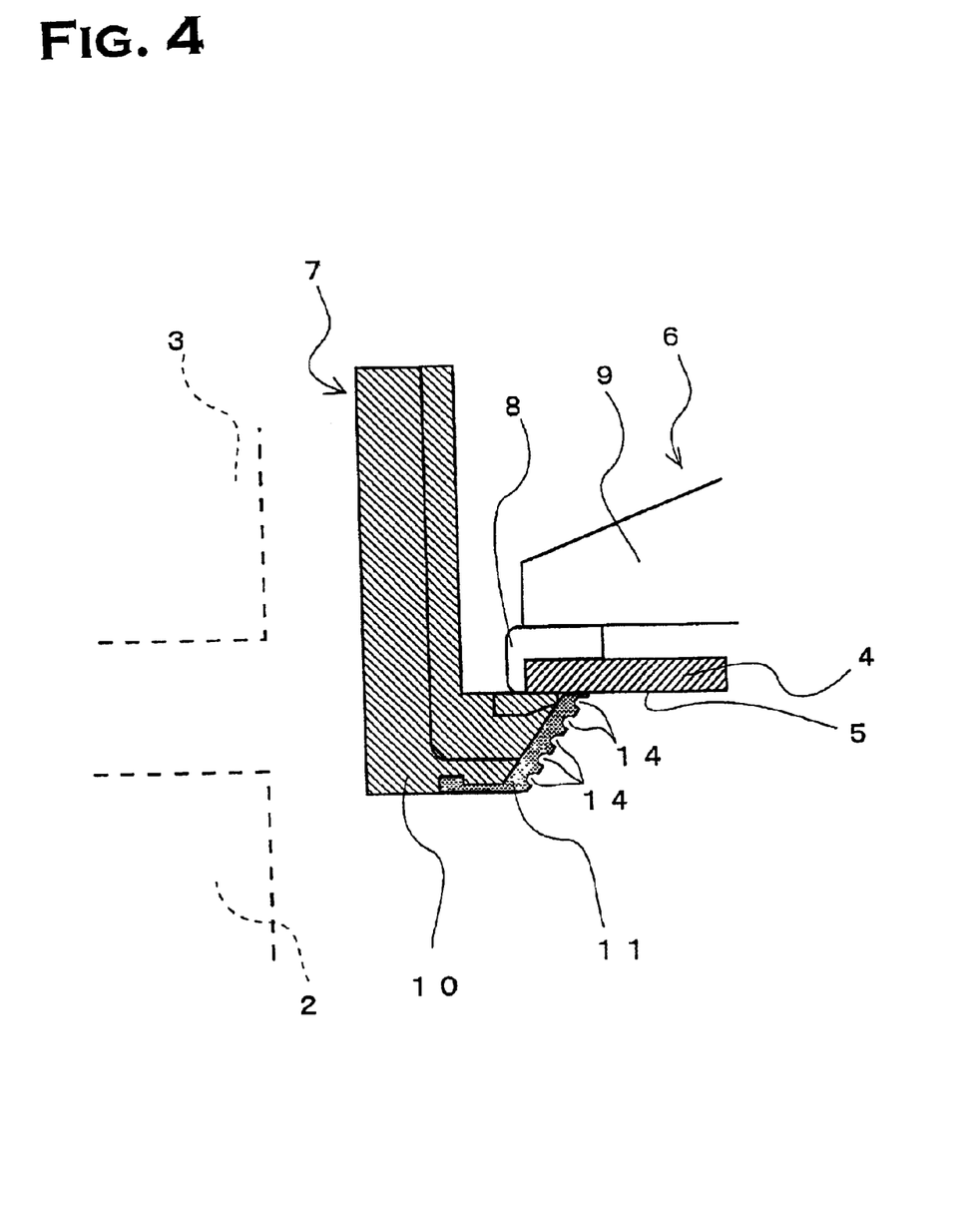
FIG. 4 is a partially enlarged sectional view showing a wafer plating apparatus in accordance with a second embodiment.
Figure 5:
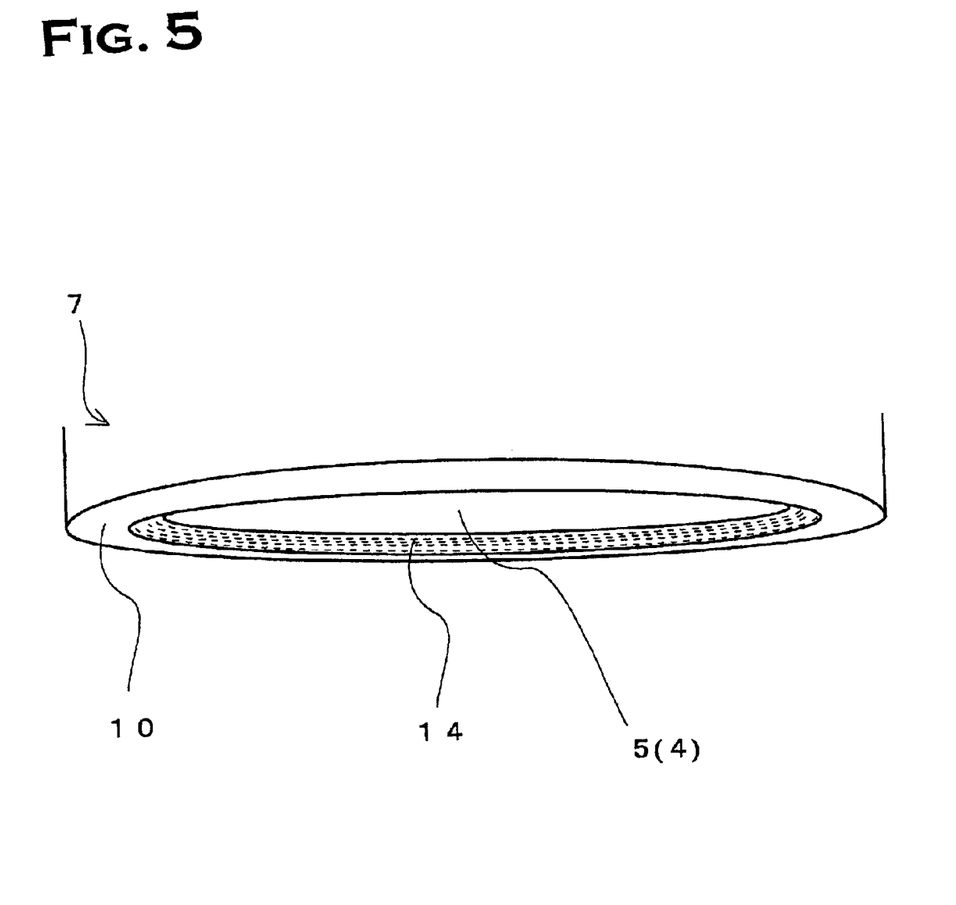
FIG. 5 is a schematic perspective view showing a wafer support member in accordance with the second embodiment.

Next, in a second embodiment, a wafer plating apparatus having a spiral groove formed on the inner peripheral surface of the wafer support portion of the apparatus is described. FIG. 4 is an enlarged sectional view showing one portion of the wafer plating apparatus in accordance with the second embodiment, and FIG. 5 is a perspective view showing the wafer support member. Since other portions such as a plating tank 2, an outer tank 3, and a solution-supply nozzle 13 are the same as shown in the first embodiment, descriptions thereof will be omitted.

The spiral groove 14 in accordance with the second embodiment is formed on the liquid seal 11 mounted on the inner peripheral surface side of the wafer support portion 10, as illustrated in FIGS. 4 and 5 (in FIG. 5, the spiral groove 14 is simplified and is indicated by broken lines). However, when there is no liquid seal 11 on the inner peripheral surface of the wafer support portion 10, a similar effect can be obtained by forming the spiral groove 14 directly on the wafer support portion 10. The air tending to remain on the peripheral edge of the surface to be plated 5 thereby enters into the spiral groove 14; then, with the rotation of the wafer support portion, the air successively moves in the spiral groove 14 from the side of surface to be plated 5 toward the lower end of the wafer support portion 10, and is ultimately discharged to the outer peripheral side of the wafer support portion 10.

For the spiral groove 14 in accordance with the second embodiment, the plating solution supplied through the solution-supply nozzle 13 provided in the plating tank 2 to the peripheral edge of the surface to be plated 5 allows an efficient discharge of air to the outer periphery side of the wafer support portion 10, as well.

Third Embodiment

Figure 6:
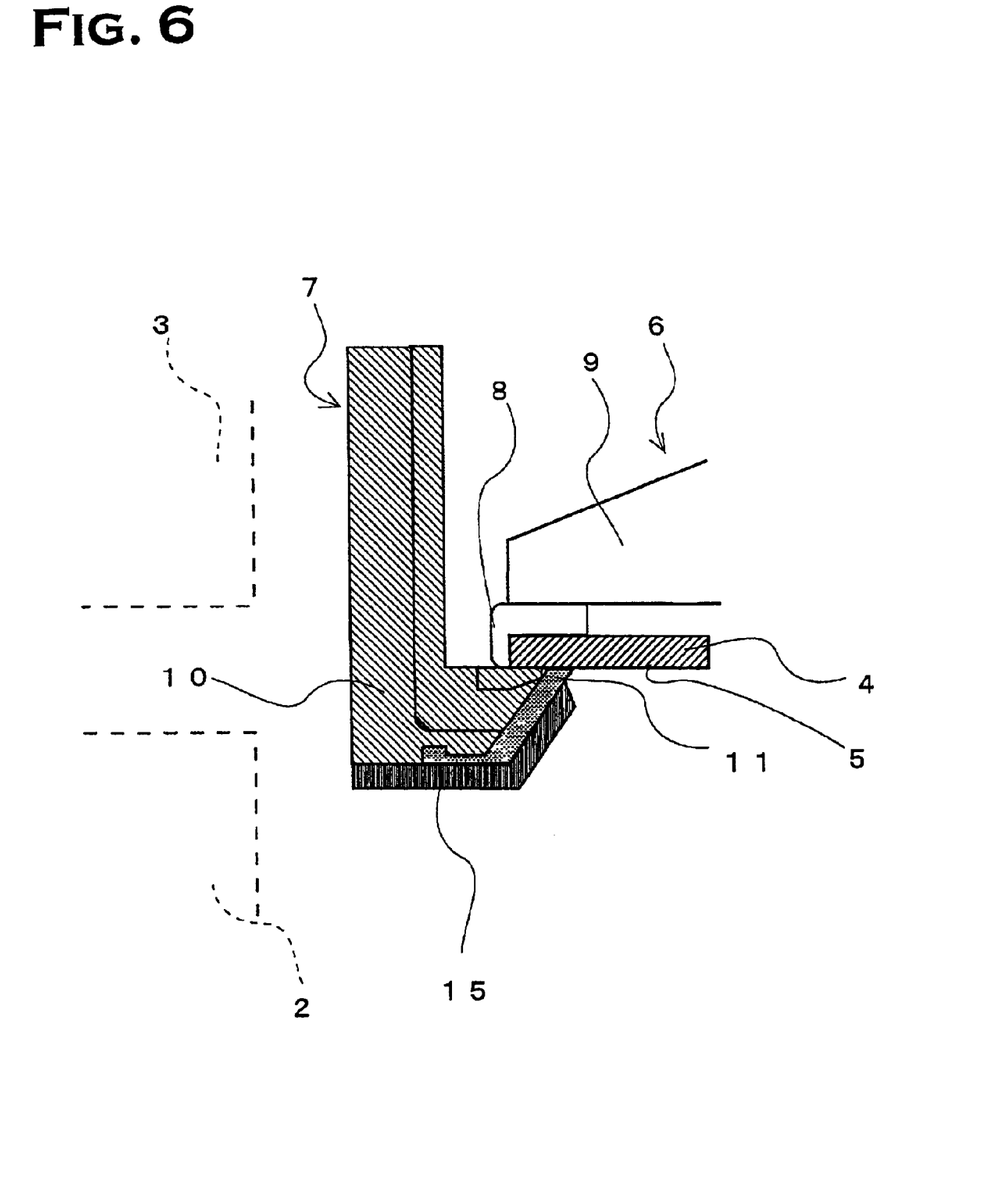
FIG. 6 is a partially enlarged sectional view showing a wafer plating apparatus in accordance with a third embodiment.
Figure 7:
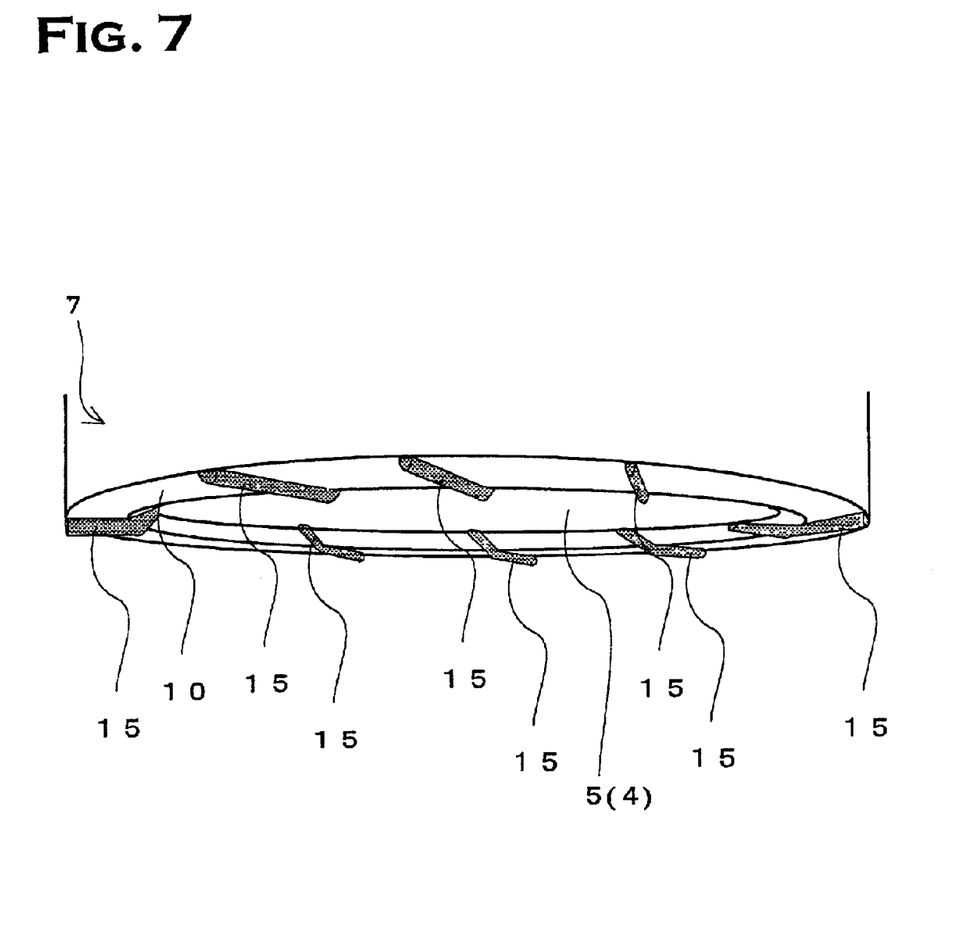
FIG. 7 is a schematic perspective view showing a wafer support member in accordance with the third embodiment.
Figure 8:
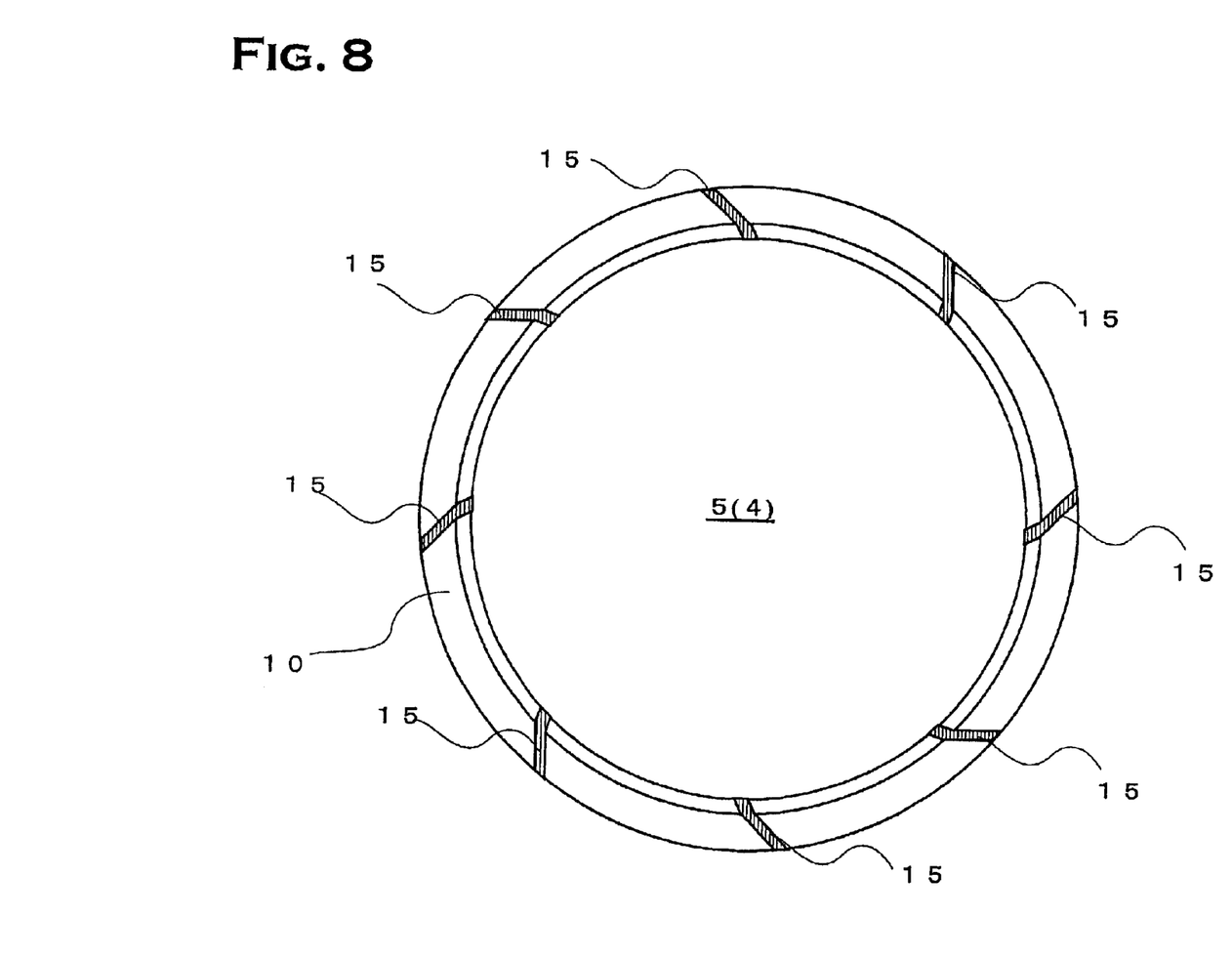
FIG. 8 is a schematic bottom view showing the wafer support member in accordance with the third embodiment.

Next, in a third embodiment, a wafer plating apparatus having guide wings formed at the lower end of the wafer support portion is described. FIG. 6 is an enlarged sectional view showing one portion of the wafer plating apparatus in accordance with the third embodiment, FIG. 7 is a perspective view showing the wafer support member thereof, and FIG. 8 is a schematic view showing the wafer support member, as seen from the bottom side thereof. Since other portions such as a plating tank 2, an outer tank 3, and a solution-supply nozzle 13 are the same as shown in the first embodiment, descriptions thereof will be omitted.

As illustrated in FIGS. 6 and 7, the guide wings in the third embodiment are provided as guide fins 15, from the vicinity of the surface to be plated 5 along the lower end of the wafer support portion 10, and are plurally arranged, as illustrated in FIG. 8, on the entire periphery of the wafer support portion 10, radially with respect to the center of the wafer 4.

By providing these guide fins 15, the air tending to remain on the peripheral edge is discharged to the outside of the wafer support portion 10, while the wafer is rotated during a plating process, that is, while the wafer support portion is rotated. Also, the plating solution supplied through the solution-supply nozzle 13 provided in the plating tank 2 to the peripheral edge of the surface to be plated 5 allows an efficient discharge of air to the outside of the wafer support portion 10.

From the results of the plating processing performed using each of the above-described wafer plating apparatuses in accordance with the first through third embodiment, it has been confirmed that uniform plating can be performed over a significantly wide range up to the peripheral edge of the surface to be plated, and that plating can be performed with respect to a larger area than in the case of conventional wafer plating apparatuss. Also, when a wafer coated with a Cu seed metal was plated with a plating solution of copper sulfate, the plating was readily performed with the seed metal scaresly dissolved, and a plated surface which was uniform and which had an excellent appearance was obtained.

Each of the above-described wafer plating apparatuss according to the present invention eliminates non-uniform plating caused by air on the peripheral edge of the surface to be plated, allows more uniform plating up to the peripheral edge of the surface to be plated to be performed, and improves the production yield of the wafer. Furthermore, even when a wafer with a seed metal is plated with a plating which is likely to dissolve the seed metal, the dissolution of the seed metal can be minimized, and hence, a relatively uniform plating can be realized.

What is claimed is:

1. A wafer plating apparatus comprising:
    a wafer support member having a wafer clamp for holding a wafer with the wafer surface to be plated facing down, and having a wafer support portion which has an L-shaped cross-section and which is capable of supporting the surface to be plated over its entire peripheral edge; and
    a plating tank in which a plating solution is circulated while the plating solution is made to overflow from an upper opening,
    said wafer plating apparatus performing plating, while the wafer surface to be plated is laid face down, being maintained in contact with the surface of the plating solution, and while the wafer is rotated, in a state in which the wafer is clamped by the wafer clamp and the wafer support member,
    wherein the wafer support member has a spiral groove for discharging air remaining on the peripheral edge of the surface to be plated while the surface of the plating solution and the wafer are in contact with each other, the spiral groove being formed on the inner peripheral surface side of the wafer support portion.

2. A wafer plating apparatus as claimed in claim 1, wherein a solution-supply nozzle is provided in the plating tank, the solution-supply nozzle forcibly supplying the plating solution to the peripheral edge of the surface to be plated.

3. A wafer plating apparatus comprising:
    a wafer support member having a wafer clamp for holding a wafer with the wafer surface to be plated facing down, and having a wafer support portion which has an L-shaped cross-section and which is capable of supporting the surface to be plated over its entire peripheral edge; and
    a plating tank in which a plating solution is circulated while the plating solution is made to overflow from an upper opening,
    said wafer plating apparatus performing plating, while the wafer surface to be plated is laid face down, being maintained in contact with the surface of the plating solution, and while the wafer is rotated, in a state in which the wafer is clamped by the wafer clamp and the wafer support member,
    wherein the wafer support member has guide wings for discharging air residing on the peripheral edge of the surface to be plated while the surface of the plating solution and the wafer are in contact with each other, the guide wings being formed on the bottom surface of the wafer support member.

4. A wafer plating apparatus as claimed in claim 3, wherein a solution-supply nozzle is provided in the plating tank, the solution-supply nozzle forcibly supplying the plating solution to the peripheral edge of the surface to be plated.

5. A wafer plating apparatus as claimed in claim 3, wherein said guide-wings comprise ridges in a radial direction along said bottom surface of the wafer support member.

6. A wafer plating apparatus as claimed in claim 5, wherein said guide-wings are disposed in equal intervals around the perimeter of said bottom surface of the wafer support member.

7. A wafer plating apparatus as claimed in claim 5, wherein a solution-supply nozzle is provided in the plating tank, the solution-supply nozzle forcibly supplying the plating solution to the peripheral edge of the surface to be treated.

8. A wafer plating apparatus comprising:

a wafer support member having a wafer clamp for holding a wafer with the wafer surface to be plated facing down, and having a wafer support portion which has an L-shaped cross-section and which is capable of supporting the surface to be plated over its entire peripheral edge; and a plating tank in which a plating solution is circulated while the plating solution is made to overflow from an upper opening, said wafer plating apparatus performing plating, while the wafer surface to be plated is laid face down, being maintained in contact with the surface of the plating solution, and while the wafer is rotated, in a state in which the wafer is clamped by the wafer clamp and the wafer support member, wherein the wafer support member has guide wings for discharging air residing on the peripheral edge of the surface to be plated while the surface of the plating solution and the wafer are in contact with each other, the guide wings being formed on an inner periphery side of and on the bottom surface of the wafer support member.

* * * * *